(12) United States Patent
Levesque et al.

(10) Patent No.: US 7,874,433 B2
(45) Date of Patent: Jan. 25, 2011

(54) SEISMICALLY SOUND RACK SYSTEM

(75) Inventors: Stewart A. Levesque, Scotland, CT (US); Lars R. Larsen, Old Lyme, CT (US)

(73) Assignee: Ortronics, Inc., New London, CT (US)

( * ) Notice: Subject to any disclaimer, the term of this patent is extended or adjusted under 35 U.S.C. 154(b) by 728 days.

(21) Appl. No.: 11/116,902

(22) Filed: Apr. 28, 2005

(65) Prior Publication Data

US 2006/0243680 A1 Nov. 2, 2006

(51) Int. Cl.
A47F 7/00 (2006.01)
(52) U.S. Cl. ...................................... 211/26
(58) Field of Classification Search ............ 211/26, 211/183; 312/223.1, 265.4; 361/724; 174/50, 174/135; 135/16, 25.4
See application file for complete search history.

(56) References Cited

U.S. PATENT DOCUMENTS

| | | | |
|---|---|---|---|
| 1,957,362 A | 5/1934 | Smith | |
| 2,875,902 A | 3/1959 | Ayars, Jr. | |
| 4,497,411 A | 2/1985 | DeBortoli | |
| 4,553,674 A | 11/1985 | Yoshikawa et al. | |
| 4,690,286 A | 9/1987 | Horne et al. | |
| 4,715,502 A | 12/1987 | Salmon | |
| 4,732,281 A | 3/1988 | Hall, II et al. | |
| 5,004,107 A | 4/1991 | Sevier et al. | |
| 5,250,752 A | 10/1993 | Cutright | |
| 5,284,254 A | 2/1994 | Rinderer | |
| 5,323,916 A | 6/1994 | Salmon | |
| 5,363,613 A | 11/1994 | Sevier | |
| 5,683,001 A | 11/1997 | Masuda et al. | |
| 5,819,956 A | 10/1998 | Rinderer | |
| 5,975,315 A * | 11/1999 | Jordan | 211/26 |
| 5,979,672 A | 11/1999 | Gemra et al. | |
| 5,983,590 A | 11/1999 | Serban | |
| 6,006,925 A * | 12/1999 | Sevier | 211/26 |
| 6,179,133 B1 | 1/2001 | Reece | |
| 6,223,909 B1 | 5/2001 | Mendoza | |
| 6,279,756 B1 * | 8/2001 | Walter et al. | 211/26 |
| 6,293,637 B1 * | 9/2001 | Anderson et al. | 312/265.1 |
| 6,321,917 B1 | 11/2001 | Mendoza | |
| 6,338,413 B1 | 1/2002 | Walter et al. | |
| 6,349,837 B1 | 2/2002 | Serban | |
| 6,481,582 B1 * | 11/2002 | Rinderer | 211/26 |

(Continued)

FOREIGN PATENT DOCUMENTS

GB 815777 7/1959

(Continued)

*Primary Examiner*—Sarah Purol
(74) *Attorney, Agent, or Firm*—McCarter & English, LLP

(57) ABSTRACT

Rack systems are provided for use in mounting or positioning of electronic components and other equipment. The disclosed rack systems that are seismically sound and adapted for packaging/shipment in a disassembled condition. The rack systems include at least one upright, a base assembly and a top frame assembly. The base assembly includes a base unit, at least one internal upright brace and at least one external upright brace. The base assembly defines a bounded region for receipt of an upright. Similarly, the top frame assembly defines a bounded region for receipt of the opposite end of the upright. When assembled at a desired location, the disclosed rack systems comply with applicable seismic-related design and performance parameters, including specifically the Zone 4 standard, and accommodate desirable cable management functions.

17 Claims, 7 Drawing Sheets

U.S. PATENT DOCUMENTS

| | | | |
|---|---|---|---|
| 6,489,565 B1 | 12/2002 | Krietzman et al. | |
| 6,517,174 B2 | 2/2003 | Sevier | |
| 6,527,351 B1 | 3/2003 | Sevier et al. | |
| 6,541,705 B1 * | 4/2003 | McGrath | 174/99 R |
| 6,561,602 B1 | 5/2003 | Sevier et al. | |
| 6,629,614 B2 | 10/2003 | Jordan | |
| 6,702,125 B2 * | 3/2004 | Hartel | 211/26 |
| 6,708,830 B2 * | 3/2004 | Mendoza | 211/26 |
| 6,719,150 B2 * | 4/2004 | Marraffa | 211/49.1 |
| 6,951,288 B2 * | 10/2005 | Henderson | 211/26 |
| 7,128,219 B2 * | 10/2006 | Marraffa | 211/49.1 |
| 7,259,326 B2 * | 8/2007 | Nguyen | 174/50 |
| 2003/0062326 A1 * | 4/2003 | Guebre-Tsadik | 211/26 |
| 2006/0138062 A1 * | 6/2006 | Dahmer et al. | 211/26 |
| 2007/0012223 A1 * | 1/2007 | Flusche | 108/26 |
| 2007/0034758 A1 * | 2/2007 | Bates | 248/218.4 |
| 2007/0074751 A1 * | 4/2007 | Fraser | 135/98 |
| 2007/0236058 A1 * | 10/2007 | Yeider | 297/184.1 |
| 2007/0251557 A1 * | 11/2007 | Carter et al. | 135/25.4 |
| 2007/0283987 A1 * | 12/2007 | Reyes et al. | 135/16 |

FOREIGN PATENT DOCUMENTS

| | | |
|---|---|---|
| GB | 983471 | 2/1965 |
| JP | 40-19881 | 9/1940 |

* cited by examiner

SEISMICALLY SOUND RACK SYSTEM

TECHNICAL FIELD

The present disclosure is directed generally to rack systems for use in positioning of electronic components and/or equipment and, more particularly, to rack systems that are seismically sound and adapted for packaging/shipment in a disassembled condition.

BACKGROUND OF THE DISCLOSURE

Cable management systems (such as cable racks, bays or frames, which are hereinafter referred to as "racks") have long been used in many varied applications, such as in communications and electronic services, and are generally located in indoor rooms, closures, offices or controlled environmental vaults. A known common construction that has evolved for such racks is one having a tall, rectangular frame, typically constructed with two uprights attached to a base and a top member. The uprights are typically open channel construction, thereby facilitating the routing of cables therethrough. In typical installations, the rack is securely bolted to the floor, and may be associated with several other racks that are adjacently aligned. The structured cable arrangements in the racks vary, but such racks typically have cables routed in the upright elements of the racks, wherefrom particular cables turn and extend horizontally across the rack to interconnect to devices, for example, cross connect or patch panels which are mounted on and/or attached to the racks.

As a result of high fill rates and increasingly higher service densities assigned to current cables, there is an increasingly important need for cable management systems to deliver fault free structural and cable support performance during naturally occurring and human caused catastrophic events, such as those caused by seismic events, earthquakes and/or explosions. Poor rack structural performance during such events can result in potentially large cable and equipment service failures. This is unacceptable, not only in terms of the repair and replacement costs or lost service revenues associated with the restoration of such failures, but more importantly because of the potential threat to the health and well being of those who depend on the communications supported by the cables. Poor rack structural performance can also directly harm personnel working around the rack.

Requirements for earthquake resistance, in terms of the forces and wave forms that the rack should be able to resist, are described in the Zone 4 (now known as Telcordia Technologies) test standard entitled GR-63-Core, Network Equipment Building System (NEBS) (hereinafter the "Zone 4 standard"), the contents of which are hereby incorporated by reference. The design of rack systems that meet the foregoing Zone 4 standard has been of importance to rack manufacturers and suppliers, and has influenced purchasing decisions in a variety of applications and installation environments.

One approach to the requirements associated with seismic disturbances and/or compliance with the foregoing Zone 4 standard has been to reinforce the rack base with metal gussets (see, e.g., U.S. Pat. No. 5,004,107 to Sevier et al.; U.S. Pat. No. 5,819,956 to Rinderer; U.S. Pat. No. 5,975,315 to Jordan; U.S. Pat. No. 5,983,590 to Serban, and U.S. Pat. No. 6,279,756 to Walter et al.). Another approach to addressing potential seismic issues has been the employment of reinforced, rigid rack construction (see, e.g., U.S. Pat. No. 6,006,925 to Sevier; U.S. Pat. No. 6,517,174 to Sevier; U.S. Pat. No. 6,527,351 to Sevier et al.; U.S. Pat. No. 6,561,602 to Sevier et al.; and U.S. Pat. No. 6,293,637 to Anderson et al.).

In each of the known seismic racks that meet the foregoing Zone 4 standard, the design and assembly of the rack are such that seismic rack is necessarily transported and delivered to the intended installation site in a fully fabricated/assembled condition. This prior art requirement that seismic racks be fully assembled by the rack manufacturer represents a significant limitation on the flexibility associated with packaging, delivery and storage of the seismic racks, and generally increases costs associated with packaging and transport thereof.

Seismically sound racks are generally deployed in environments where enhanced seismic-resistant functionality is required or potentially important. Other parameters beyond seismic-resistance properties may be influence rack design, e.g., depending on the deployment needs. Exemplary parameters and/or considerations that may influence rack design include fabrication costs, maintenance-related issues, space and size standards, accessibility requirements, cable and apparatus protection, and appearance. As noted above, one parameter/consideration that has not been embodied in known seismically sound racks is the facility for racks to be in a disassembled state during shipment to and while stored at a destination site, whereupon the racks may be assembled when required at the destination site.

Existing racks and cabinets that have a seismic Zone 4 rating are fully welded frame assemblies. The manufacturing impact of this design is that the product must be welded into its 24"×16"×7' configuration and then sent through the rest of the factory to be washed, painted and packed in one piece. For the distributor and the customer, this requirement means that the rack/cabinet must be stocked and shipped in its assembled configuration and shipped as one unit per pallet, either bolted to the pallet in an upright orientation or arranged as two racks laying down on a 4'×7' pallet.

Thus, despite efforts to date in the field of rack design, there remains a need for improved rack designs that meet applicable seismic-related performance parameters. More particularly, there remains a need for seismic racks that may be shipped and stored in a disassembled state, while still complying with applicable seismic-related performance parameters. These and other needs are satisfied by the seismic rack designs disclosed herein. Additional advantageous features and functionalities of the present invention will be apparent from the disclosure which follows, particularly when reviewed in conjunction with the accompanying drawings.

SUMMARY OF THE DISCLOSURE

The present disclosure is directed to rack systems for use in mounting and/or positioning of electronic components and/or equipment. More particularly, the present disclosure is directed to rack systems that are seismically sound and adapted for packaging/shipment in a disassembled condition. By "disassembled state" or "disassembled configuration", it is meant that the uprights associated with the disclosed rack are disassembled from the base unit(s) or base member(s), such that the uprights may be packaged, transported and/or stored (e.g., for inventory purposes) separately from and/or in an overlying and/or stacked orientation with respect to the base unit(s)/member(s). The disclosed rack systems advantageously comply with applicable seismic-related design and performance parameters, including specifically the Zone 4 standard, and accommodate desirable cable management functions.

The disclosed seismically sound racks are thus shippable in a disassembled configuration and are readily assembled at the final destination location site. The seismically sound rack in the assembled state successfully resists structural failures that may otherwise result from violent lateral vibratory forces applied to the rack structure, e.g., during Zone 4 seismic events. The disclosed rack systems may be fabricated to with conventional dimensional characteristics, e.g., in terms of height, width, depth and rack unit spacing.

According to exemplary embodiments of the present disclosure, the disclosed rack system includes a base frame assembly, first and second uprights, and a top assembly. The base frame assembly includes internal and external upright braces that define a bounded region that is configured and dimensioned for receipt of the lower portion of an upright. An exemplary external upright brace includes a planar member that is configured and dimensioned to overlay the floor-like surface of a box unit. First and second wall members extend upwardly from the planar member. When the external upright brace is positioned on the floor-like surface of the box unit, the first and second wall members are advantageously welded with respect to the outer wall of the base unit to provide structural rigidity to the base frame assembly.

The internal upright brace is generally of a U-shaped configuration, with a side wall and a pair of extension walls joined with respect to the side wall, e.g., in a perpendicular orientation with respect to the side wall. According to exemplary embodiments of the disclosed seismic rack, the extension walls are integral with the side wall, and the internal upright brace is formed through a bending operation. The internal upright brace is advantageously welded with respect to the planar member of the external upright brace. The extension walls are internal to and spaced from the first and second side walls of the external upright brace. The side wall of the internal upright brace is internal to and spaced from the outer wall of the base unit. Thus, a bounded region is defined between the outer wall of the base unit, the internal upright brace and external upright brace, the bounded region being adapted to receive an upright, e.g., in connection with assembly of the disclosed seismic rack.

According to exemplary embodiments of the present disclosure, the top frame assembly includes a U-shaped structure that is similar in design to the inner upright brace. However, in the case of the top frame assembly, the U-shaped structure is configured and dimensioned to be positioned external to the upper portion of an upright, thereby further stabilizing the disclosed seismic rack when fully assembled.

The disclosed seismic rack is advantageously designed such that significant stability/rigidity is provided through the structural interaction of the base frame assembly and the upright(s), when assembled. Indeed, the stability/rigidity of the disclosed seismic rack has satisfied the Zone 4 standard, even when assembled by an end user and/or at an installation site (as opposed to factory assembled). The disclosed seismic rack may be packaged, shipped/transported and/or stored in inventory in disassembled state, thereby enhancing the efficiencies and cost savings associated with manufacture, delivery and storage thereof. Additional benefits, features and functions associated with the disclosed seismic rack will be readily apparent to persons skilled in the art from the detailed description which follows, particularly when read in conjunction with the figures appended hereto.

BRIEF DESCRIPTION OF THE DRAWINGS

For a better understanding of the rack assemblies disclosed herein, including exemplary designs and methods for assembly and use thereof, reference is made to the following detailed description of exemplary embodiments considered in conjunction with the accompanying drawings, in which.

DETAILED DESCRIPTION OF EXEMPLARY EMBODIMENT(S)

According to the present disclosure, advantageous rack systems are provided that may, when assembled, be used for mounting and/or positioning of electronic components and/or equipment. The seismic racks of the present disclosure may be used in a wide variety of applications and environments, e.g., in connection with communications and electronic services applications. The seismic racks of the present disclosure may be positioned in a host of physical locations, e.g., in indoor rooms, closures, offices or controlled environmental vaults. Moreover, the advantageous ability to package, transport and store the disclosed racks in a disassembled condition makes the disclosed racks ideal for applications that are difficult to reach due to tight quarters, e.g., submarine installations and the like.

The disclosed seismically sound racks are shippable in a disassembled state or configuration, and are readily assembled at the final destination/location site. The seismically sound racks of the present disclosure—when assembled—successfully resist structural failures that may otherwise result from violent lateral vibratory forces applied to the rack structure, e.g., during Zone 4 seismic events.

Turning to the appended figures, an exemplary seismic rack 10 is schematically depicted in FIGS. 1-13 hereto. Although the detailed description provided herein is provided with reference to exemplary seismic rack 10, the present disclosure is not limited to such exemplary embodiment. Rather, the present disclosure is susceptible to modifications, variations and/or enhancements without departing from the spirit or scope of the present disclosure, as will be readily apparent to persons of ordinary skill in the art.

Figure 1:
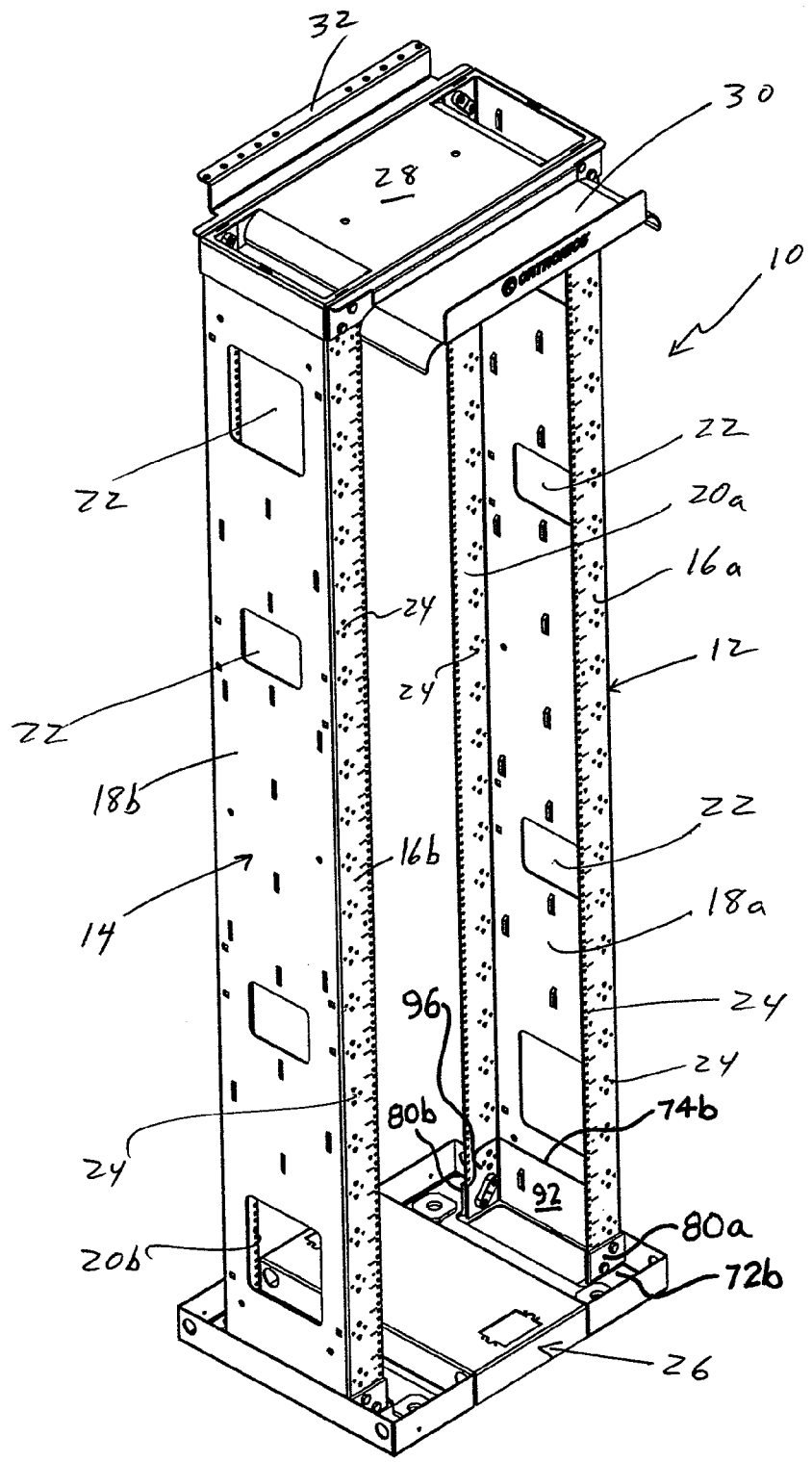
FIG. 1 is a perspective view of an exemplary seismic rack in an assembled state according to an embodiment of the present disclosure.
Figure 2:
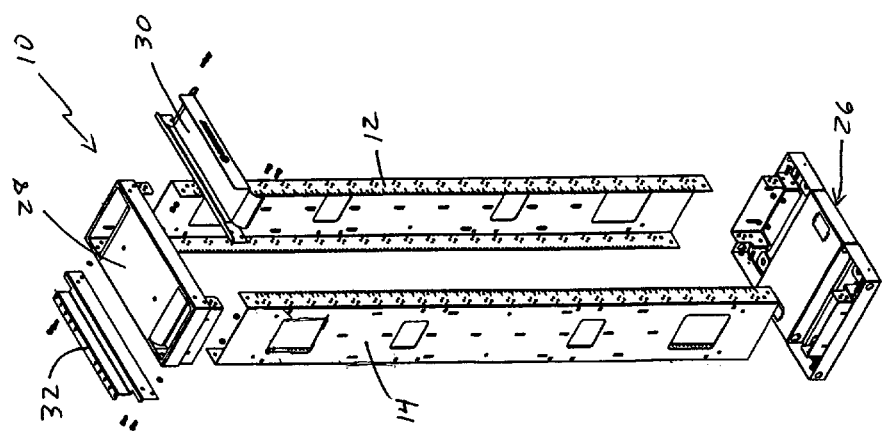
FIG. 2 is an exploded perspective view of an exemplary seismic rack according to the present disclosure.

With initial reference to FIGS. 1 and 2, seismic rack 10 includes first and second uprights 12, 14. The uprights 12, 14 are substantially U-shaped and define front faces 16a, 16b, side faces 18a, 18b and rear faces 20a, 20b. Uprights 12, 14 include a plurality of openings 22 in side faces 18a, 18b to facilitate cable routing/cable management, as is known in the art. For purposes of the present disclosure, the quantity, size and relative positioning of openings 22 is not significant to the particular advantages of the disclosed rack systems. Similarly, the front and rear faces 16, 18 of uprights 12, 14 include spaced apertures 24 that facilitate the mounting of rack units and/or cable managers, as is known in the art. For purposes of the present disclosure, familiarity of conventional rack-related features and functionalities is presumed.

With further reference to FIGS. 1 and 2, seismic rack 10 includes a base frame assembly 26 and top frame assembly 28. Both base assembly 26 and top frame assembly 28 define a substantially rectangular outer perimeter that, in combination with uprights 12, 14, form the fundamental structural components of seismic rack 10. However, one or more ancillary components may be mounted to seismic rack 10, e.g., front waterfall 30, rear rail 32 and the like. Assembly hardware, e.g., screws, bolts, nuts, washers and the like, is typically employed to mount ancillary component(s) to the rack structure. The functional benefits and structural attributes of such ancillary components are well known in the art, and familiarity therewith is presumed for purposes of the present disclosure.

With particular reference to FIGS. 3-6, 8, 11 and 12, structural and functional attributes of exemplary base frame assembly 26 (and the subcomponents thereof) are described in greater detail. Base frame assembly 26 includes a base unit 34 that is configured to be positioned on the floor or other substantially planar surface (e.g., a submarine deck, raised flooring structure or the like) in connection with assembly and use of seismic rack 10. As shown in the top view of FIG. 3 and the perspective view of FIG. 4, base unit 34 defines a raised central portion 36 and first and second base regions 38, 40 which are positioned on either side of central portion 36. Base unit 34 includes opposed outer side walls 42, 44 and opposed front and back walls 46, 48, that together define the outer periphery of base unit 34.

The height and width of base unit 34 may vary, as will be apparent to persons skilled in the art, but in an exemplary embodiment of seismic rack 10, the overall length of each of front and back walls 46, 48 is approximately 24 inches, while the overall length of each of opposed side walls 42, 44 is approximately 18.25 inches. The height of the side walls, front wall and back wall is generally substantially constant around the periphery of base unit 33 and, in an exemplary embodiment of the present disclosure, is about 2.5 inches. The width of the central raised portion 36 is typically about ten (10) inches.

Central raised portion 36 contributes to the overall strength and rigidity of base unit 34. A pair of spaced openings 50a, 50b are defined in raised portion 36 for cable management purposes, e.g., for passage of cables therethrough. Similarly, a plurality of passages 52a, 52b, 52c, 52d are formed in the interior walls 54, 56 that define the boundaries between raised portion 36 and base regions 38, 40 to facilitate cable management. Further cable management passages 58a, 58b and 60a, 60b are typically formed in side walls 42, 44, respectively. The precise quantity, size and relative positioning of such cable management passages is not critical to the present disclosure. Rather, appropriate cable management passages should be provided in the design/fabrication of base unit 34, as will be apparent to persons skilled in the art based on the detailed description provided herein.

Figure 3:
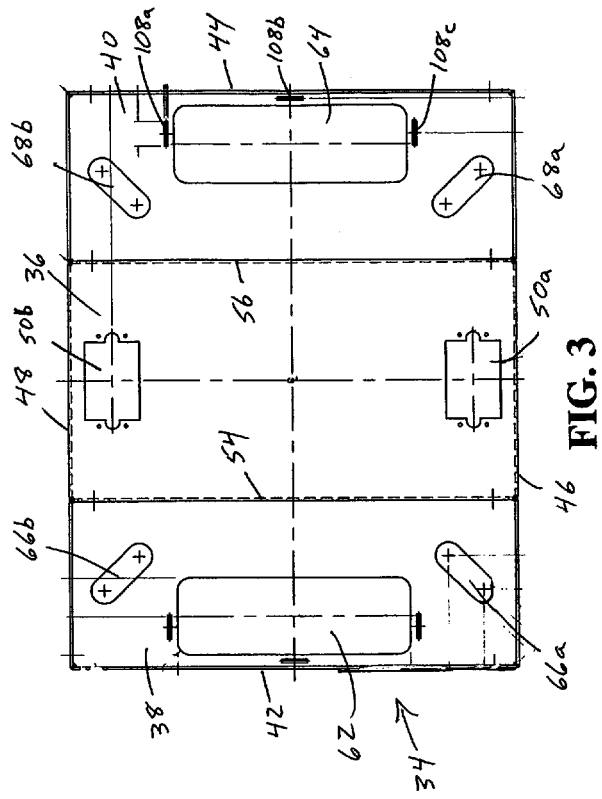
FIG. 3 is a top view of a base unit according to an exemplary embodiment of the present disclosure.
Figure 4:
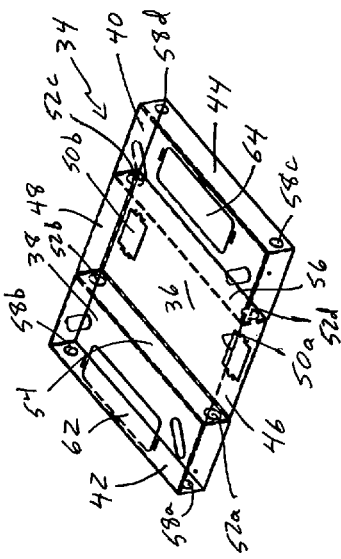
FIG. 4 is a bottom view of the exemplary base unit of FIG. 3.

With further reference to FIGS. 3 and 4, base unit 34 includes relatively large cable management openings 62, 64 in first and second base regions 38, 40, respectively. In exemplary embodiments of the present disclosure, openings 62, 64 are substantially rectangular in geometry, although radiused corners are typically provided to minimize potential sharp edges that might snag or damage cables routed therethrough and/or pose a potential injury risk for rack users. The overall size and positioning of openings 62, 64 is typically selected so as to fall within the confines of uprights 12, 14 when rack 10 is assembled, as will be apparent from the description which follows. Additionally openings 66a, 66b and 68a, 68b are formed in first and second base regions 38, 40. Openings 66, 68 are typically angularly oriented relative to the walls of base unit 34, and are configured and dimensioned to facilitate mounting of rack 10 relative to the underlying surface, e.g., a floor. In exemplary embodiments of the present disclosure, washer systems with cooperating bolts/screws are employed with openings 66, 68 to mount rack 10 to an underlying floor surface.

Figure 12:
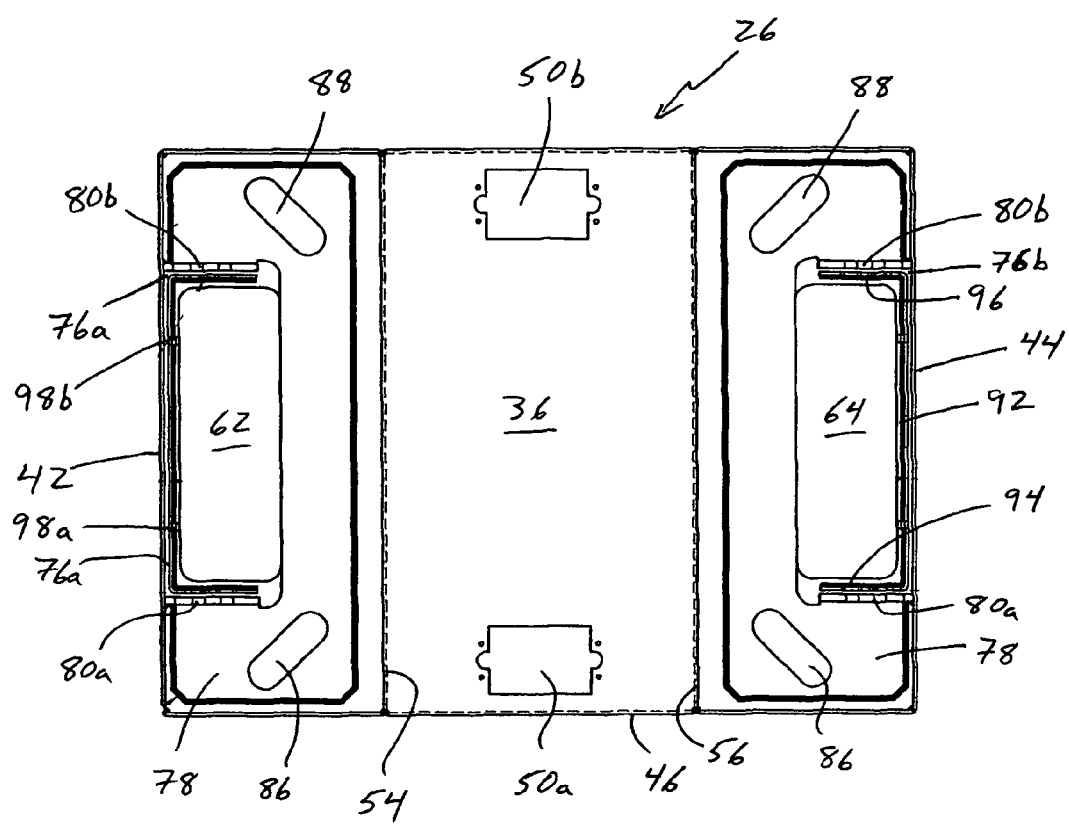
FIG. 12 is a plan view of the exemplary base frame assembly of FIG. 11.

According to exemplary embodiments of the present disclosure, base unit 34 forms one component of an advantageous base frame assembly 26 which, in its fully assembled configuration, is best seen in FIG. 12. Additional components that are incorporated in base frame assembly 26 include a pair of external upright braces 72a, 72b and a pair of internal upright braces 74a, 74b. As assembled, bounded regions 76a, 76b are defined by the internal upright braces, external upright braces and side walls of base unit 34, as described in greater detail below. Bounded regions 76a, 76b are advantageously configured and dimensioned to receive the lower portions of uprights 12, 14, thereby facilitating efficacious assembly of seismic rack 10, e.g., at a desired installation site.

Figure 5:
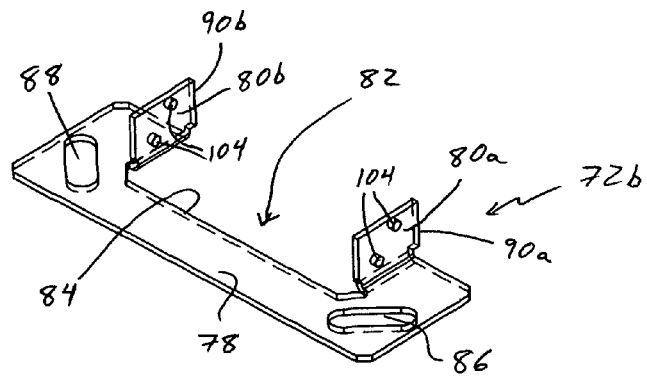
FIG. 5 is a perspective view of an exemplary external upright brace according to the present disclosure.

With particular reference to FIG. 5, an exemplary external upright brace 72b according to the present disclosure is schematically depicted. Of note, external upright brace 72a is generally fabricated as the mirror image of external upright brace 72a, as will be readily to apparent to persons of skill in the art. External upright brace 72a generally includes a substantially planar member 78 and a pair of spaced, opposed wall members 80a, 80b. Wall members 80a, 80b are substantially perpendicular to planar member 78 and, in exemplary embodiments of the present disclosure, are formed through a metal forming process that involves bending of the wall members 80a, 80b upward from planar member 78. Thus, according to exemplary embodiments, wall members 80a, 80b are integral with planar member 78, thereby enhancing the strength/rigidity of external upright brace 72.

External upright brace 72 defines an open region 82 between opposed wall members 80a, 80b and an inner edge 84 of planar member 78. Open region 84 is configured and dimensioned to cooperate with an internal upright brace 74b and base unit 34 to define a bounded region 76b for receipt of an upright 12, 14. Moreover, open region 84 is generally sized and positioned so as to substantially align with opening 64, i.e., to facilitate cable management therethrough. A pair of angularly oriented slotted regions 86, 88 are also provided to facilitate mounting of seismic rack 10 relative to an underlying surface, e.g., a floor. In this regard, slotted regions 86, 88 are typically configured and dimensioned to substantially align with openings 68a, 68b, respectively, that are formed in base unit 34.

The overall dimensions and geometry of planar member 78 are selected such that external upright brace 72b is adapted to fit within second base region 40 of base unit 34. Similarly, external upright brace 72a is configured and dimensioned to fit within first base region 38 of base unit 34. As noted above, the cable management passages and floor mounting openings of the respective components are configured and dimensioned to be substantially aligned when external upright braces 72a, 72*b* are introduced to first and second base regions 38, 40, respectively. According to exemplary embodiments of the present disclosure, planar member 78 is welded with respect to the underlying planar surface of base region 38, 40. In this way, enhanced strength/rigidity is imparted to base frame assembly 26.

In addition, outer surfaces 90*a*, 90*b* of wall members 80*a*, 80*b* are substantially planar and are adapted to engage the inner surface of side wall 44 of base unit 34 when outer upright brace 72*b* is positioned within second base region 40. Outer surfaces 90*a*, 90*b* are advantageously welded with respect to wall members 80*a*, 80*b*, thereby imparting enhanced strength and rigidity to base frame assembly 26. Similarly, the outer surfaces of the wall members associated with external upright brace 72*a* are welded with respect to the inner surface of side wall 42, thereby establishing comparable stability/rigidity at the opposite end of base frame assembly 26. Indeed, the welding of components associated with base frame assembly 26, as described herein, contributes to compliance with the Zone 4 standard, as will be apparent to persons skilled in the art.

Figure 6:
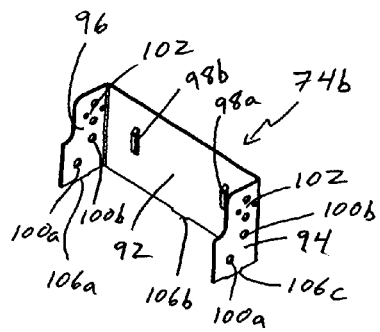
FIG. 6 is a perspective view of an exemplary internal upright brace according to the present disclosure.
Figure 11:
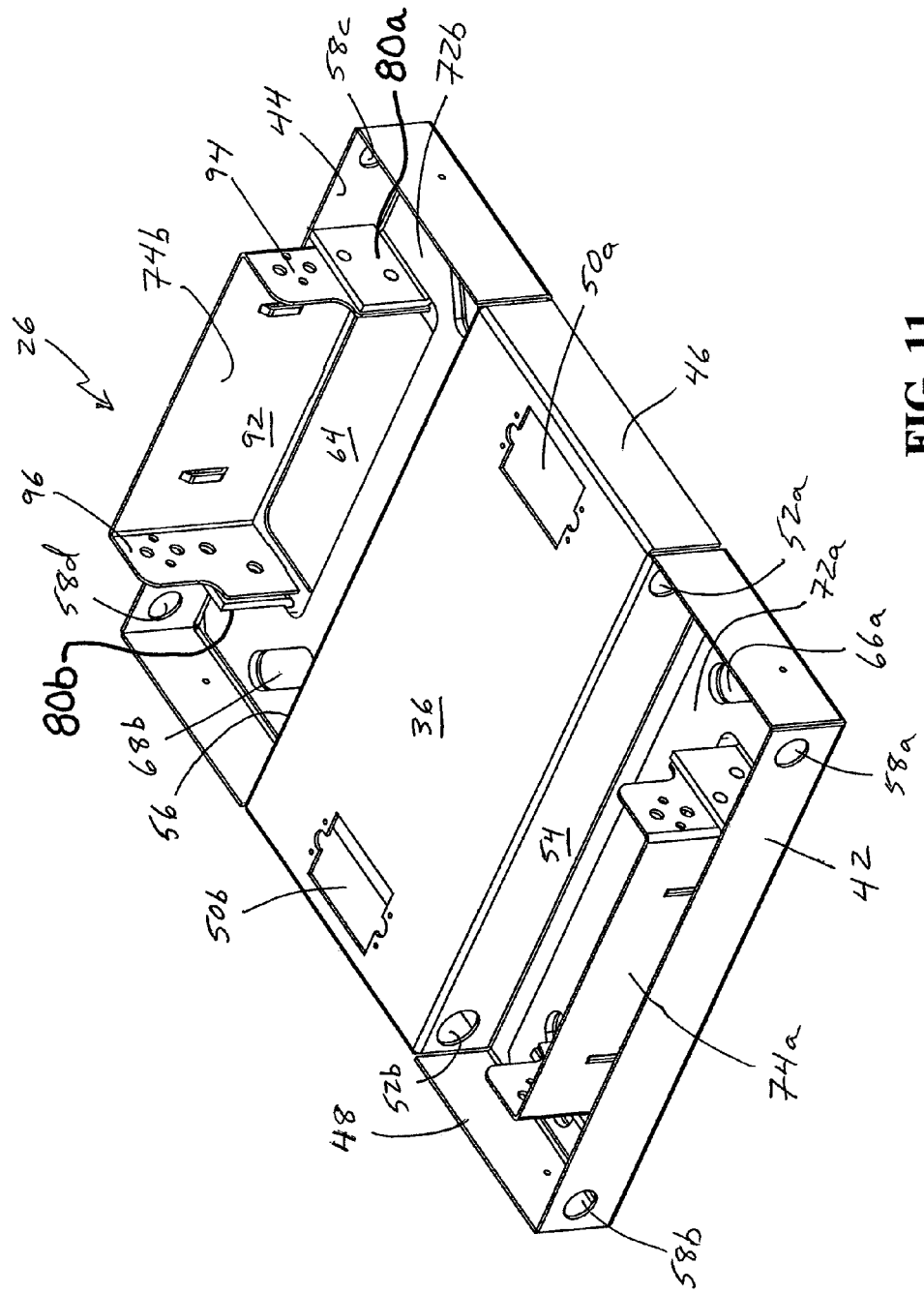
FIG. 11 is a perspective view of a base frame assembly according to an exemplary embodiment of the present disclosure.

Turning to the design and function of internal upright braces 74*a*, 74*b*, reference is made to FIGS. 6 and 11. Exemplary internal upright brace 74*b* is schematically depicted in FIG. 6 and includes side wall 92 and a pair of extension walls 94, 96. A pair of lances 98*a*, 98*b* is formed in the surface of side wall 92. Lances 98*a*, 98*b* are adapted to interact with an upright 12, 14, when assembled with base frame assembly 26. Side wall 92 is typically taller than extension walls 94, 96, thereby providing enhanced strength and stability to the disclosed seismic rack design. According to exemplary embodiments of the present disclosure, extension walls 94, 96 feature a contoured geometry, which according to exemplary embodiments of the present disclosure, slopes the height of internal upright brace 74*a*, 74*b* from the greater height of side wall 92 to the lesser height of the wall members 80*a*, 80*b* of the external upright braces 72*a*, 72*b*.

In addition, extension walls 94, 96 each include two sets of apertures: a first set of apertures 100*a*, 100*b* that are in an angled relative orientation, and a second set of apertures (collectively apertures 102) that are in a diamond-like alignment. Apertures 100*a*, 110*b* are configured and dimensioned to align with corresponding pairs of apertures (collectively apertures 104) formed in wall members 80*a*, 80*b* of the external upright brace. Thus, when an upright 12, 14 is assembled to base frame assembly 26, bolts are typically passed through the aligned apertures and corresponding apertures formed toward the bottom of the upright and secured with washer/nut members. The apertures 102 in the diamond-like alignments are similarly configured and dimensioned to cooperate with similarly arranged apertures formed in upright 12, 14, as generally shown in FIGS. 1 and 2.

Of note, the lower edge of internal upright brace 74*b* includes a series of alignment notches 106*a*, 106*b*, 106*c* that are adapted to cooperate with notches 108*a*, 108*b*, 108*c* formed around opening 64 in base region 40. Comparable alignment features are generally provided at the opposite end of base frame assembly 26, i.e., to facilitate alignment between internal upright brace 74*a* and base region 38. Once the internal upright brace 74 is aligned with the cooperating notches formed in the corresponding base region 38, 40, the internal upright brace 74 is welded with respect to the base region 38, 40, thereby enhancing the stability and rigidity therebetween. The internal upright brace 74 is advantageously configured and dimensioned in a manner such that, when assembled with an upright, no potential rack units are sacrificed by reason of the design of and/or interaction with the base frame assembly 26.

In addition to facilitating the positioning of the internal upright brace 74 with respect to the base region 38, 40, the relative positioning of notches 108*a*, 108*b*, 108*c* serves to ensure that the internal upright brace 74 is properly positioned relative to the corresponding external upright brace 72 and the side wall 42, 44 of base unit 34. As best seen in FIGS. 11 and 12, proper positioning is important for defining a bounded region 76*a*, 76*b* of appropriate dimension to accommodate introduction of upright 12, 14 within such bounded region 76*a*, 76*b*. Thus, according to exemplary embodiments of the present disclosure, the bounded regions 76*a*, 76*b* are substantially U-shaped and are open on either end thereof. The clearance defined by bounded regions 76*a*, 76*b* is selected to accommodate introduction of an upright 12, 14, but with limited play. Thus, a typical width for bounded regions 76*a*, 76*b* is about 0.125 inches, although alternative spacings may be utilized for particular >applications (e.g., based on the thickness of the uprights), as will be readily apparent to persons skilled in the art.

Figure 7:
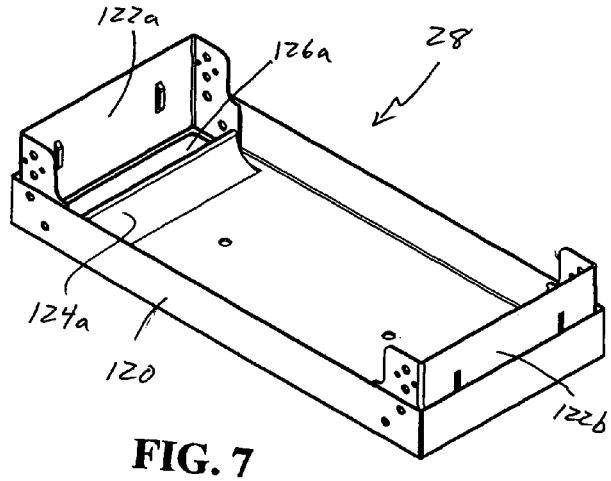
FIG. 7 is a perspective view of a top frame assembly according to an exemplary embodiment of the present disclosure.
Figure 8:
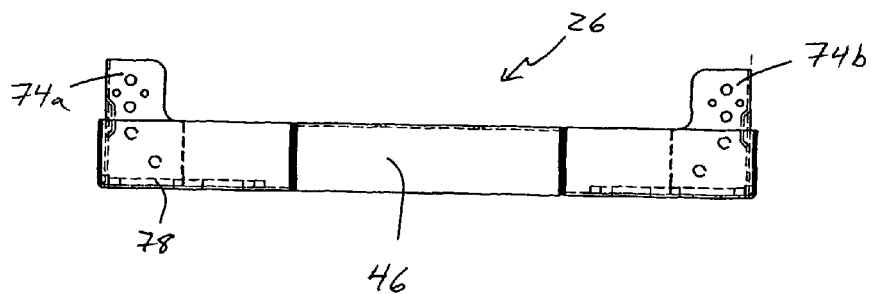
FIG. 8 is a side view of an exemplary base frame assembly.
Figure 9:
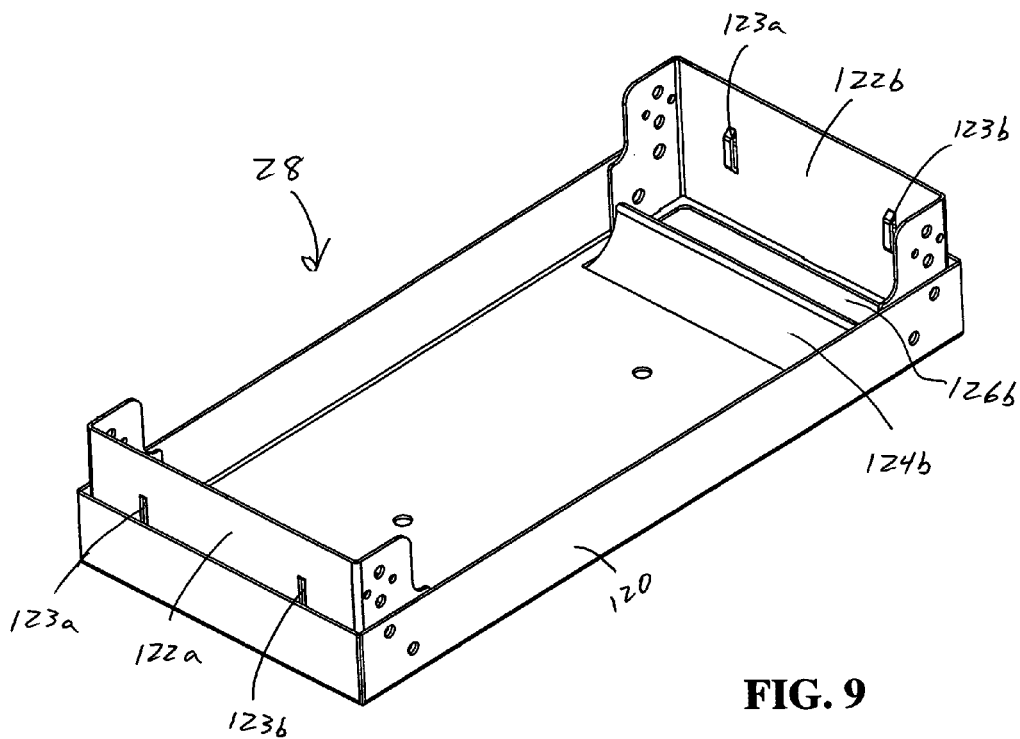
FIG. 9 is a further perspective view of the top frame assembly of FIGS. 7 and 8.
Figure 10:
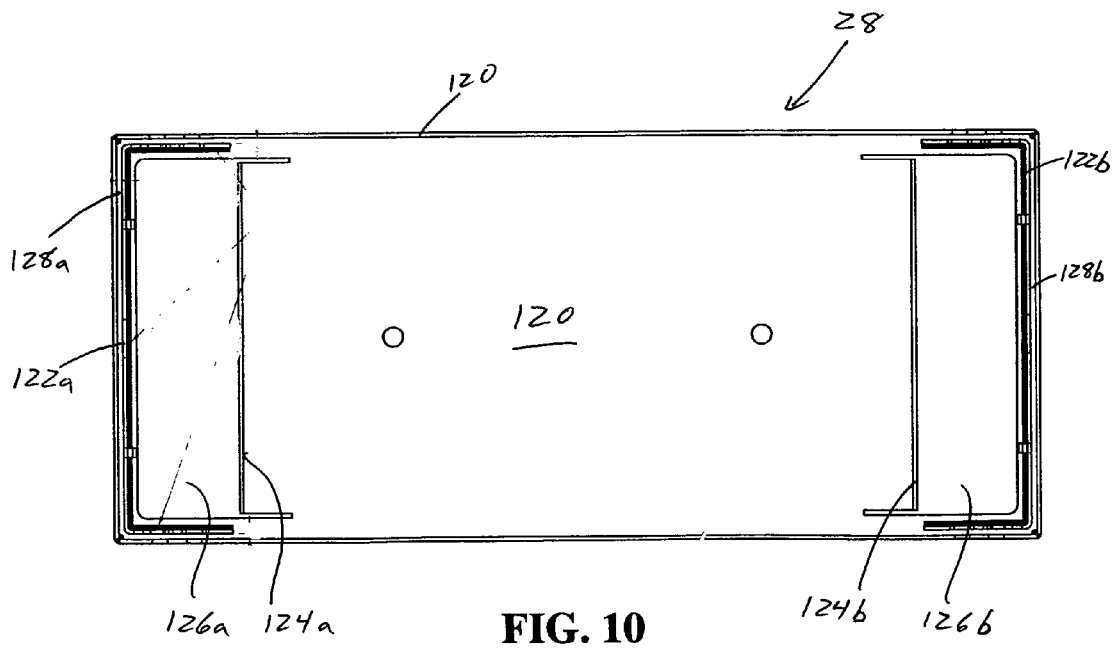
FIG. 10 is a plan view of the exemplary top frame assembly of FIGS. 7-9.

With reference to FIGS. 7 and 9-10, the disclosed seismic rack 10 further includes a top frame assembly 28. According to exemplary embodiments of the present disclosure, top frame assembly 28 includes a substantially rectangular top frame 120 and a pair of U-shaped internal braces 122*a*, 122*b*. Lances 123*a*, 123*b* are typically formed in the internal braces 122*a*, 122*b* to facilitate interaction with uprights 12, 14. Aperture patterns similar to those described with reference to internal upright braces 74*a*, 74*b* are typically provided on internal braces 122*a*, 122*b* for securing top frame 28 relative to uprights 12, 14, e.g., using bolts/washers/nuts, as will be apparent to persons skilled in the art.

In addition, in exemplary embodiments of the present disclosure, arcuate or curved cable guide elements 124*a*, 124*b* extend downward from top frame 120. Cable passage openings 126*a*, 126*b* are formed in top frame 120, with guide elements 124*a*, 124*b* positioned adjacent thereto for cable management purposes. A substantially U-shaped bounded region 128*a*, 128*b* is formed at both ends of top frame 120 to accommodate receipt of the top ends of uprights 12, 14. The width of bounded regions 128*a*, 128*b* is generally comparable to the bounded regions 76*a*, 76*b* formed on base frame assembly 26, e.g., about 0.125 inches, although alternative spacings may be employed, as will be apparent to persons skilled in the art.

Thus, the disclosed rack systems, which include a base assembly, first and second uprights, and a top frame assembly, are advantageously adapted for on-site assembly by sliding uprights into predefined bounded regions formed in the base assembly and the top frame assembly. To facilitate receipt of the uprights, the base assembly and the top frame assembly define what may be termed a "ski boot" type design, whereby welded structural elements define pockets or founded regions into which the uprights may be slid/positioned. In the case of the base assembly, exemplary embodiments of the present disclosure include internal and external upright braces that define the bounded region for receipt of the lower portion of an upright. Exemplary top assemblies according to the present disclosure include an internal brace that defines a bounded region in cooperation with the outer wall of a top frame. The components of the disclosed seismic rack are typically fabricated from an appropriate metal, e.g., steel.

The strength of the disclosed seismic rack systems and their advantageous ability to withstand the forces generated during a seismic event is associated, at least in part, with the fact that the uprights are supported by the disclosed welded assemblies. Moreover, the fact that the disclosed seismic racks may be packaged, transported and/or stored in a disassembled condition is highly advantageous for manufacturers, distributors, installers and system users. Indeed, the "knock down" design of the disclosed seismic racks dramatically improves the manufacturability of the product, allowing smaller and lighter pieces to be painted and packaged. For the distributor and the customer, the disclosed "knock down" design means that ten racks can be stored in the space of two conventional seismic racks, and that receipt and movement of the product at the job site is simplified.

Figure 13:
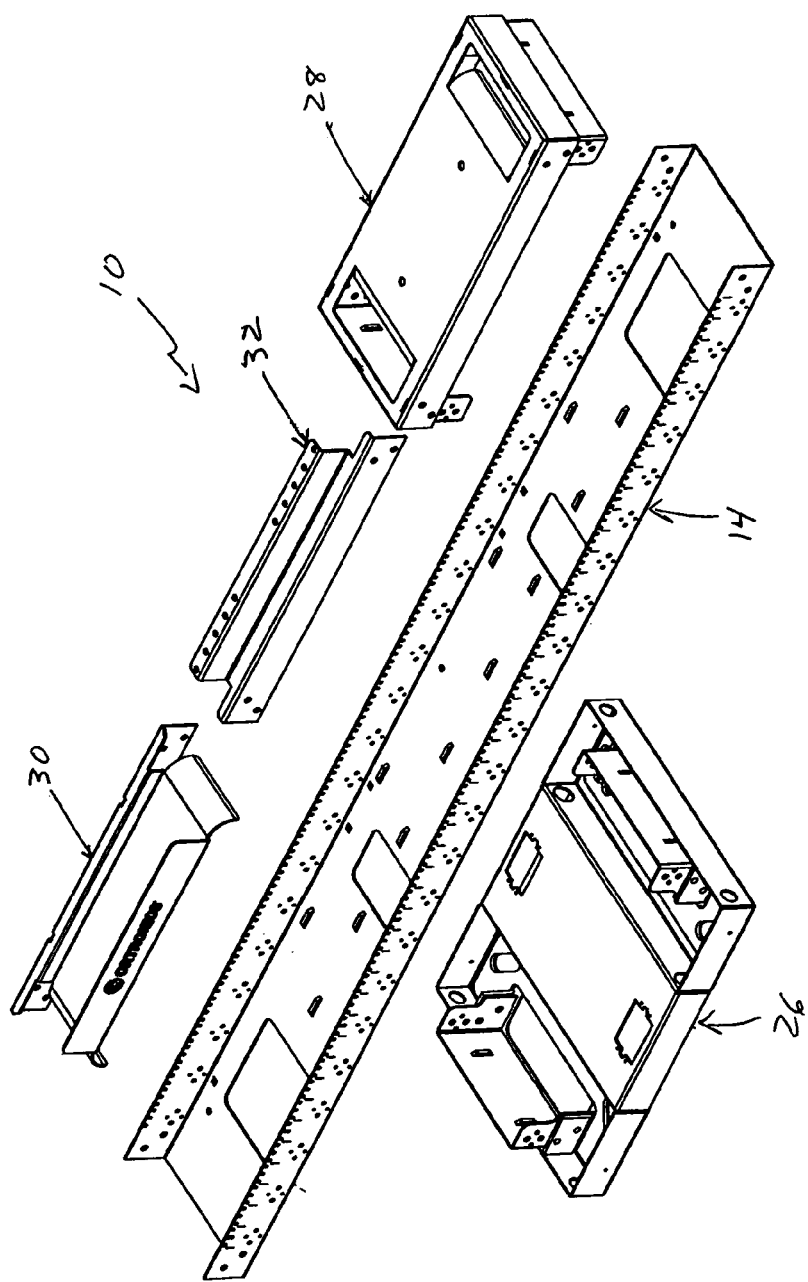
FIG. 13 is an exploded perspective view of an exemplary packing arrangement of the principal components of a seismic rack according to the present disclosure.

With reference to FIG. 13, an exemplary packaging layout for an exemplary seismic rack 10 of the present disclosure is schematically depicted in an exploded orientation. As shown in FIG. 13, base assembly 10 is positioned at a first level, with upright 14 laid on its side thereover, i.e., as a second packing level. Top frame assembly 28, front waterfall 30 and rear rail 32 are positioned in a side-by-side orientation atop upright 14, i.e. as a packing third level. A second upright 12 (not pictured) is advantageously positioned atop the top frame assembly 28, front waterfall 30 and rear rail 32, as a fourth packing level. Connecting hardware and assembly instructions (and any other desired accessory components, e.g., cable management racks and the like) are typically included in the box/container at a desired level, as will be readily apparent to persons skilled in the art The foregoing components may be positioned in a box or other container system (not pictured), with conventional packing materials, e.g., bubble wrap, foam inserts or the like, for shipping and storage. Once in a desired site location, the components may be removed from the box or other container system, and assembled in the manner described above.

Seismic rack designs according to the present disclosure have been tested and have passed the Zone 4 (GR-63-CORE) testing standard. More particularly, the specific product design that has been tested was a 2 post rack in two sizes. Based on these favorable test results, it is expected that the disclosed seismic rack design will also yield Zone 4 compliant products in alternative configurations, e.g., 2 post standard EIA racks, 4 post racks, 4 post EIA racks, and cabinets.

Although the present invention has been described with reference to exemplary embodiments thereof, it is to be understood that the present invention is not limited to the disclosed exemplary embodiments. Rather, the present invention extends and encompasses various modifications, variations and/or enhancements to the present disclosure that do not depart from the spirit or scope thereof. For example, the quantity and/or layout of attachment apertures that facilitate assembly of the disclosed base frame and upright may be modified without departing from the disclosed invention. Similarly, the geometric configuration of various elements and/or components described herein with reference to exemplary embodiments may be modified without departing from the present disclosure. For example, the internal upright brace need not be "U-shaped" in geometry, provided an appropriately dimensioned bounded region is defined for receipt of an upright. Thus, alternative geometric configurations may be employed without departing from the spirit or scope of the present disclosure. Additional modifications, variations and enhancements will be apparent to persons skilled in the art based on the detailed description provided herein, and such modifications, variations and enhancements are expressly encompassed within the scope of the present invention.

The invention claimed is:

1. A rack assembly for supporting electronic components at a vertical displacement relative to a support surface, such as a deck or floor structure, comprising:
   (a) at least one elongated, vertically oriented, U-shaped upright with a U-shaped horizontal cross-section when viewed along a line with a vertical orientation, said U-shape exhibiting a pair of substantially parallel side portions, each having a free end and connected distally from the free end by a bridging portion extending between the side portions;
   (b) a base assembly including a base unit with a floor oriented generally parallel to the support surface, said base unit having a vertically extending wall rigidly attached to said floor proximate at least a portion of a periphery of said floor, an internal upright brace disposed within and rigidly attached to the base unit, said internal upright brace having a vertically extending wall having a U-shaped cross-section adapted to complementarily mate with an interior surface of said U-shaped upright and an external upright brace disposed within and rigidly attached to the base unit, said external upright brace having a pair of opposed vertically extending walls spaced apart a distance approximating the distance between opposing exterior surfaces of the U-shaped upright measured between the parallel side portions of the U-shape, said internal brace, said external brace and said wall of said base unit conjointly defining a U-shaped gap therebetween having a depth and width dimensioned to matingly receive a length of the at least one upright proximate a first end thereof, and
   (c) a top frame assembly defining a top bounded region that is configured and dimensioned to receive a length of a second end of the at least one upright.

2. A rack assembly according to claim 1, wherein the at least one upright includes a side wall, and wherein the side wall includes at least one passage configured and dimensioned for cable passage.

3. A rack assembly according to claim 1, wherein the base assembly is substantially rectangular and includes a base unit that defines a first base region, a second base region and a raised central portion.

4. A rack assembly according to claim 1, wherein the external upright brace includes a planar member to which said pair of opposed vertically extending walls are rigidly conjoined at a generally perpendicular orientation relative thereto.

5. A rack assembly according to claim 4, wherein each of said pair of walls of said external brace has an outer edge and wherein the outer edges are welded to the wall of the base unit.

6. A rack assembly according to claim 4, wherein the base unit defines a first base region, and wherein the planar member is configured and dimensioned to fit within the first base region.

7. A rack assembly according to claim 6, wherein the planar member is welded to the floor of the base unit in the first base region.

8. A rack assembly according to claim 4, wherein a cable management opening is defined between the spaced, opposed walls of the external brace.

9. A rack assembly according to claim 1, wherein the U-shaped wall of the internal upright brace includes a pair of substantially parallel side walls and a bridging wall extending therebetween.

10. A rack assembly according to claim 9, wherein a lower edge of the U-shaped wall of the internal upright brace is welded to the floor of the base unit.

11. A rack assembly according to claim 9, wherein the bridging wall of the internal upright brace is of greater height than the pair of opposed walls of the external upright brace.

12. A rack assembly according to claim 1, wherein the at least one upright, the base assembly and the top frame assembly are adapted to be transported to an installation site in a disassembled state and assembled at the installation site.

13. A rack assembly according to claim 12, wherein the at least one upright, the base assembly and the top frame assembly are packaged for transport to an installation site in a multi-level configuration.

14. A rack assembly according to claim 1, wherein the top bounded region is defined by a top internal upright brace and an outer wall of a top frame.

15. A rack assembly according to claim 14, wherein the top frame assembly further includes at least one arcuate cable guide element.

16. A rack assembly according to claim 1, further comprising a front waterfall and a rear rail.

17. A rack assembly according to claim 1, wherein the at least one upright, the base assembly and the top frame assembly are assembled to define a rack selected from the group consisting of a 2 post rack, a 2 post standard EIA rack, a 4 post rack, a 4 post EIA rack, and a cabinet.

* * * * *